(12) United States Patent
Tseng et al.

(10) Patent No.: US 11,815,473 B2
(45) Date of Patent: Nov. 14, 2023

(54) METHODS OF INSPECTING SAMPLES WITH MULTIPLE BEAMS OF CHARGED PARTICLES

(71) Applicant: ASML Netherlands B.V., Veldhoven (NL)

(72) Inventors: Kuo-Feng Tseng, San Jose, CA (US); Zhonghua Dong, Sunnyvale, CA (US); Yixiang Wang, Fremont, CA (US); Zhong-wei Chen, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/812,109

(22) Filed: Mar. 6, 2020

(65) Prior Publication Data

US 2020/0271598 A1    Aug. 27, 2020

Related U.S. Application Data

(63) Continuation of application No. PCT/EP2018/073161, filed on Aug. 28, 2018.
(Continued)

(51) Int. Cl.
*G01N 23/203* (2006.01)
*G01N 23/2252* (2018.01)
(Continued)

(52) U.S. Cl.
CPC ....... *G01N 23/203* (2013.01); *G01N 23/2252* (2013.01); *G01N 23/2254* (2013.01);
(Continued)

(58) Field of Classification Search
None
See application file for complete search history.

(56) References Cited

U.S. PATENT DOCUMENTS 5,134,526 A    7/1992    Inabata
6,541,770 B1 *  4/2003    Veneklasen .......... G01N 23/203
                                                        250/311
(Continued)

FOREIGN PATENT DOCUMENTS

CN    106575594 A    4/2017
CN    107112183 A    8/2017
(Continued)

OTHER PUBLICATIONS

Office Action issued by the ROC (Taiwan) Patent Office in related Application No. 107130927, dated Apr. 29, 2019 (9 pgs.).
(Continued)

*Primary Examiner* — Andrew Smyth
(74) *Attorney, Agent, or Firm* — FINNEGAN, HENDERSON, FARABOW, GARRETT & DUNNER, LLP

(57) ABSTRACT

Disclosed herein is an apparatus comprising: a source configured to emit charged particles, an optical system and a stage; wherein the stage is configured to support a sample thereon and configured to move the sample by a first distance in a first direction; wherein the optical system is configured to form probe spots on the sample with the charged particles; wherein the optical system is configured to move the probe spots by the first distance in the first direction and by a second distance in a second direction, simultaneously, while the stage moves the sample by the first distance in the first direction; wherein the optical system is configured to move the probe spots by the first distance less a width of one of the probe spots in an opposite direction of the first direction, after the stage moves the sample by the first distance in the first direction.

20 Claims, 10 Drawing Sheets

Related U.S. Application Data

(60) Provisional application No. 62/555,542, filed on Sep. 7, 2017.

(51) Int. Cl.
*G01N 23/2254* (2018.01)
*G01N 23/2276* (2018.01)

(52) U.S. Cl.
CPC ... *G01N 23/2276* (2013.01); *G01N 2223/309* (2013.01); *G01N 2223/33* (2013.01)

(56) References Cited

U.S. PATENT DOCUMENTS

| | | | |
|---|---|---|---|
| 6,943,349 B2 | 9/2005 | Amec et al. | |
| 7,244,932 B2* | 7/2007 | Nakasuji | G01N 23/225 250/306 |
| 7,244,949 B2 | 7/2007 | Knippelmeyer et al. | |
| 7,439,502 B2* | 10/2008 | Nakasuji | G01N 23/225 250/306 |
| 8,063,363 B2 | 11/2011 | Yeh et al. | |
| 8,294,095 B2 | 10/2012 | Chen et al. | |
| 8,362,425 B2* | 1/2013 | Han | G01N 23/2251 250/307 |
| 9,035,249 B1 | 5/2015 | Frosien et al. | |
| 9,263,233 B2 | 2/2016 | Zeidler et al. | |
| 9,607,805 B2 | 3/2017 | Liu et al. | |
| 2001/0035954 A1 | 11/2001 | Rahn et al. | |
| 2003/0223535 A1 | 12/2003 | Leedy | |
| 2007/0272859 A1* | 11/2007 | Nakasuji | G01N 23/2251 250/310 |
| 2008/0173815 A1* | 7/2008 | Nakasuji | H01J 37/28 250/310 |
| 2012/0241606 A1* | 9/2012 | Han | H01J 37/04 250/307 |
| 2015/0090879 A1* | 4/2015 | Zeidler | H01J 37/28 250/311 |
| 2015/0340201 A1* | 11/2015 | Wu | H01J 37/04 250/307 |
| 2016/0268096 A1 | 9/2016 | Ren et al. | |
| 2016/0284505 A1 | 9/2016 | Ren et al. | |
| 2017/0025241 A1 | 1/2017 | Li et al. | |
| 2017/0025243 A1 | 1/2017 | Ren et al. | |
| 2017/0154756 A1 | 6/2017 | Ren et al. | |
| 2017/0213688 A1* | 7/2017 | Ren | H01J 37/05 |
| 2018/0024082 A1 | 1/2018 | Ando | |

FOREIGN PATENT DOCUMENTS

| | | |
|---|---|---|
| JP | 2000-215834 | 8/2000 |
| JP | 2004-335193 A | 11/2004 |
| JP | 2008-053170 A | 3/2008 |
| JP | 2011-243587 | 12/2011 |
| JP | 2017-504175 A | 2/2017 |
| TW | 201250759 A | 12/2012 |
| TW | 201614706 A | 4/2016 |
| WO | WO 2012/128967 A2 | 9/2012 |
| WO | WO 2017/132435 A1 | 8/2017 |
| WO | WO 2018/122176 A1 | 7/2018 |

OTHER PUBLICATIONS

International Search Report issued in related PCT Foreign Application No. PCT/EP2018/073161; dated Jan. 2, 2019 (3 pgs.).
Notice of Reasons for Rejection issued by the Japanese Patent Office in related JP Application No. 2020-508399, dated Feb. 12, 2021 (5 pgs.).
Second Office Action issued in related Chinese Patent Application No. 201880058003.7; dated Aug. 26, 2022 (6 pgs.).
Notice of Reasons for Rejection issued in related Japanese Patent Application No. 2022-041012; dated Feb. 21, 2023 (11 pgs.).
Office Action of the Intellectual Property Office issued in related Taiwanese Patent Application No. 109100072; dated Dec. 30, 2020 (7 pgs.).
Chinese Search Report, issued by the Chinese Patent Office, corresponding with a Chinese Application No. 2018800580037, dated Jan. 25, 2022. (3 pages).
Notification of the First Office Action, issued by the Chinese Patent Office, corresponding with a Chinese Application No. 2018800580037, dated Jan. 29, 2022. (17 pages).

\* cited by examiner

METHODS OF INSPECTING SAMPLES WITH MULTIPLE BEAMS OF CHARGED PARTICLES

CROSS-REFERENCE TO RELATED APPLICATIONS

This application claims priority to International Application No. PCT/EP2018/073161, filed Aug. 28, 2018, and published as WO 2019/048293 A1, which claims priority of U.S. Provisional Application No. 62/555,542 which was filed on Sep. 7, 2017. The contents of these applications are incorporated herein by reference in their entireties.

TECHNICAL FIELD

This disclosure relates to methods for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is an apparatus comprising: a source, an optical system and a stage; wherein the source is configured to emit charged particles; wherein the stage is configured to support a sample thereon and configured to move the sample by a first distance in a first direction; wherein the optical system is configured to form probe spots on the sample with the charged particles; wherein the optical system is configured to move the probe spots by the first distance in the first direction and by a second distance in a second direction, simultaneously, while the stage moves the sample by the first distance in the first direction; wherein the optical system is configured to move the probe spots by the first distance less a width of one of the probe spots in an opposite direction of the first direction, after the stage moves the sample by the first distance in the first direction.

According to some embodiments, the charged particles comprise electrons.

According to some embodiments, the apparatus is configured to record a signal representing an interaction of the charged particles and the sample at the probe spots.

According to some embodiments, the signal includes at least one of secondary electrons, backscattered electrons, Auger electrons, X-ray, and cathodoluminescence.

According to some embodiments, the optical system is configured to move the probe spots by the second distance in an opposite direction of the second direction.

According to some embodiments, the optical system is configured to move the probe spots by $[(M-1)N+1]$ multiples of the width in the opposite direction of the first direction; wherein M is a number of the probe spots spaced apart in the first direction; wherein N is a pitch of the probe spots in the first direction in a unit of the width.

According to some embodiments, the optical system includes one or more of a lens, a stigmator, and a deflector.

Disclosed herein is a method comprising: moving a sample by a first distance in a first direction; moving probe spots formed on the sample by one or more beams of charged particles by the first distance in the first direction and by a second distance in a second direction, simultaneously, while the sample is being moved by the first distance in the first direction; moving the probe spots by the first distance less a width of one of the probe spots in an opposite direction of the first direction, after the sample is moved by the first distance in the first direction.

According to some embodiments, the charged particles comprise electrons.

According to some embodiments, the method further comprises recording a signal representing an interaction of the charged particles and the sample at the probe spots.

According to some embodiments, the signal includes at least one or secondary electrons, backscattered electrons, Auger electrons, X-ray, and cathodoluminescence.

According to some embodiments, the method further comprises moving the probe spots by the second distance in an opposite direction of the second direction.

According to some embodiments, the method further comprises: upon determination a region on the sample has been inspected by the one or more beams of charged particles, moving the probe spots by $[(M-1)N+1]$ multiples of the width in the opposite direction of the first direction; wherein M is a number of the probe spots spaced apart in the first direction; wherein N is a pitch of the probe spots in the first direction in a unit of the width.

According to some embodiments, the method further comprises moving the probe spots by the second distance in an opposite direction of the second direction.

Disclosed herein is a computer program product comprising a non-transitory computer readable medium having instructions recorded thereon, the instructions when executed by a computer implementing any of the methods above.

DETAILED DESCRIPTION

There are various techniques for inspecting a sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection technique is charged particle beam inspection, where a beam of charged particles (e.g., electrons) is directed to the sample and a signal representing the interaction (e.g., secondary emission or back-scattered emission) of the charged particles and the sample is recorded.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1:
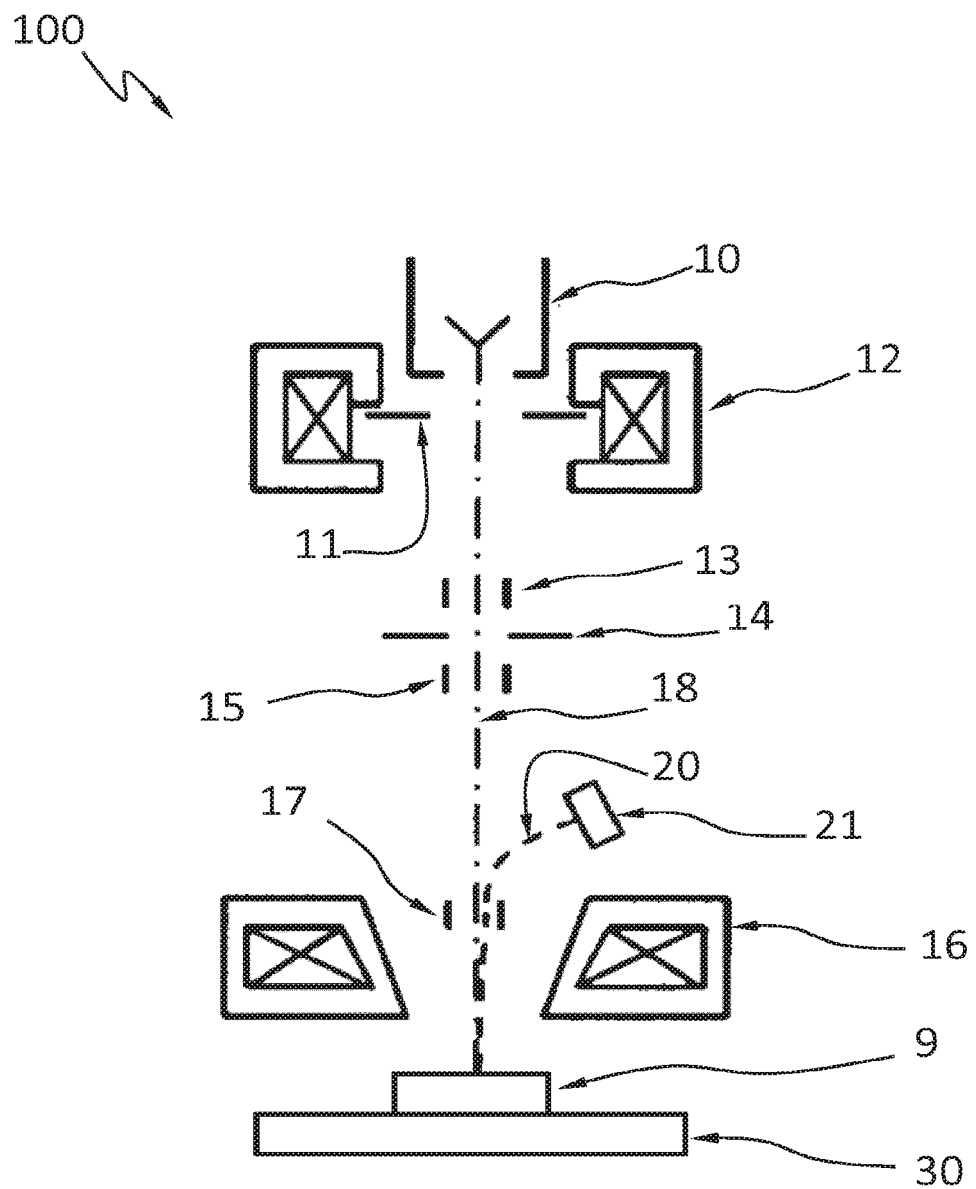
FIG. 1 schematically shows an apparatus configured to carry out charged particle beam inspection, consistent with embodiments of the present disclosure.

FIG. 1 schematically shows an apparatus 100 that can carry out charged particle beam inspection, consistent with embodiments of the present disclosure. Referring to FIG. 1, the apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample. Such components may include an E×B charged particle detour device 17 and a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the E×B charged particle detour device 17 to the signal detector 21. The processor may cause the stage 30 to move or cause the beam 18 to scan.

Charged particle beam inspection may have higher resolution than optical inspection because the charged particles used in the charged particle beam inspection have shorter wavelengths than the light used in the optical inspection. As the dimensions of the patterns on the substrate and the patterning device become smaller and smaller as the device manufacturing process evolves, charged particle beam inspection becomes more widely used. The throughput of charged particle beam inspection is relatively low due to interactions (e.g., the Coulomb effect) among the charged particles used therein. More than one beam of charged particles may be used to increase the throughput.

In an example, multiple beams of charged particles can simultaneously scan multiple regions on a sample. The scanning of the multiple beams may be synchronized or independent. The multiple regions may have overlaps among them, may be tiled to cover a continuous area, or may be isolated from one another. Signals generated from the interactions of the beams and the sample may be collected by multiple detectors. The number of detectors may be less than, equal to, or greater than the number of the beams. The multiple beams may be individually controlled or collectively controlled.

Multiple beams of charged particles may form multiple probe spots on a surface of a sample. The probe spots can respectively or simultaneously scan multiple regions on the surface. The charged particles of the beams may generate signals from the locations of the probe spots. One example of the signals is secondary electrons. Secondary electrons usually have energies less than 50 eV. Another example of the signals is backscattered electrons when the charged particles of the beams are electrons. Backscattered electrons may have energies close to landing energies of the electrons of the beams. The signals from the locations of the probe spots may be respectively or simultaneously collected by multiple detectors.

The multiple beams may be from multiple sources respectively, or from a single source. If the beams are from multiple sources, multiple columns may scan and focus the beams onto the surface, and the signals generated by the beams may be detected by detectors in the columns, respectively. An apparatus using beams from multiple sources may be referred to as a multi-column apparatus. The columns can be either independent or share a multi-axis magnetic or electromagnetic-compound objective lens (see U.S. Pat. No. 8,294,095, whose disclosure is hereby incorporated by reference in its entirety). The probe spots generated by a multi-column apparatus may be spaced apart by a distance as large as 30-50 mm.

If the beams are from a single source, a source-conversion unit may be used to form multiple virtual or real images of the single source. Each of the images and the single source may be viewed as an emitter of a beam (also called a "beamlet" as all of the beamlets are from the same source). The source-conversion unit may have an electrically conductive layer with multiple openings that can divide the charged particles from the single source into multiple beamlets. The source-conversion unit may have optics elements that can influence the beamlets to form multiple virtual or real images of the single source. Each of the images can be viewed as a source that emits one of the beamlets. The beamlets may be spaced apart by a distance of micrometers. A single column, which may have a projection system and a deflection scanning unit, may be used to scan and focus the beamlets on multiple regions of a sample. The signals generated by the beamlets may be respectively detected by multiple detection elements of a detector inside the single column. An apparatus using beams from a single source may be called as a multi-beam apparatus.

There are at least two methods to form the images of the single source. In the first method, each optics element has an electrostatic micro-lens that focuses one beamlet and thereby forms one real image, (see, e.g., U.S. Pat. No. 7,244,949, whose disclosure is hereby incorporated by reference in its entirety). In the second method, each optics element has an electrostatic micro-deflector which deflects one beamlet thereby forms one virtual image (see, e.g., U.S. Pat. No. 6,943,349 and U.S. patent application Ser. No. 15/065,342, whose disclosures are hereby incorporated by reference in their entirety). Interactions (e.g., the Coulomb effect) among the charged particles in the second method may be weaker than that in the first method because a real image may have a higher current density.

Figure 2A:
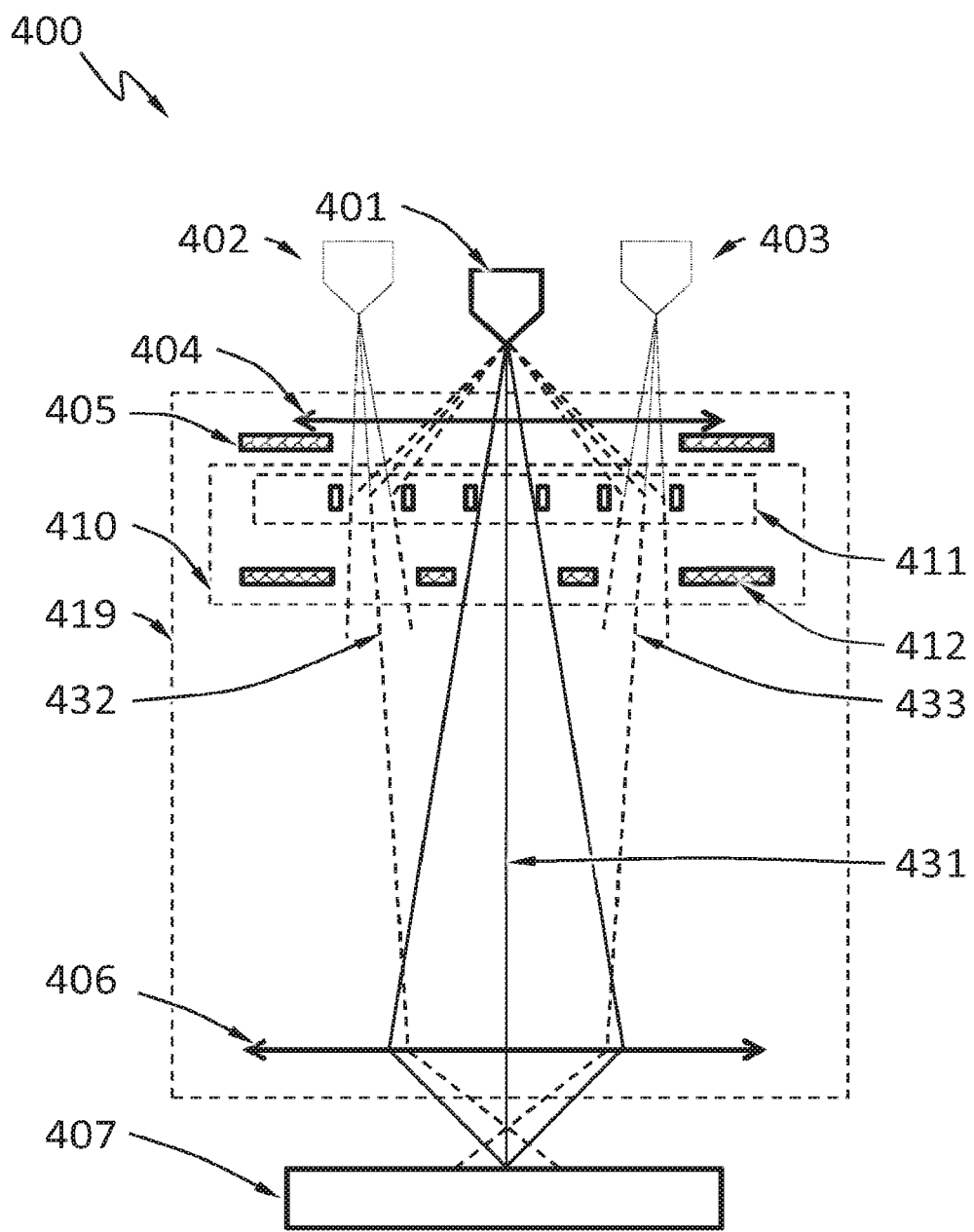
FIG. 2A schematically shows an apparatus configured to carry out charged particle beam inspection using multiple beams of charge particles, where the charged particles in the multiple beams are from a single source (a "multi-beam" apparatus).

FIG. 2A schematically shows an apparatus 400 that can carry out charged particle beam inspection using multiple beams of charge particles, where the charged particles in the multiple beams are from a single source (a multi-beam apparatus). The apparatus 400 has a source 401 that can produce charged particles in free space. In an example, the charged particles are electrons and the source 401 is an electron gun. The apparatus 400 has an optics system 419 that can generate with the charged particles multiple probe spots on a surface of a sample 407 and scan the probe spots on the surface of the sample 407. The optics system 419 may have a condenser lens 404 and a main aperture 405 upstream or downstream with respect to the condenser lens 404. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The optics system 419 has a source-conversion unit 410 configured to form multiple virtual images (e.g., virtual images 402 and 403) of the source 401. The virtual images and the source 401 each can be viewed as an emitter of a beamlet (e.g., beamlets 431, 432 and 433). The source-conversion unit 410 may have an electrically conductive layer 412 with multiple openings that can divide the charged particles from the source 401 into multiple beamlets, and optics elements 411 that can influence the beamlets to form the virtual images of the source 401. The optics elements 411 may be micro-deflectors configured to deflect the beamlets. The electric current of the beamlets may be affected by the sizes of the openings in the electrically conductive layer 412 or the focusing power of the condenser lens 404. The optics system 419 includes an objective lens 406 configured to focus the multiple beamlets and thereby form multiple probe spots onto the surface of the sample 407. The source-conversion unit 410 may also have micro-compensators configured to reduce or eliminate aberrations (e.g., field curvature and astigmatism) of the probe spots.

Figure 2B:
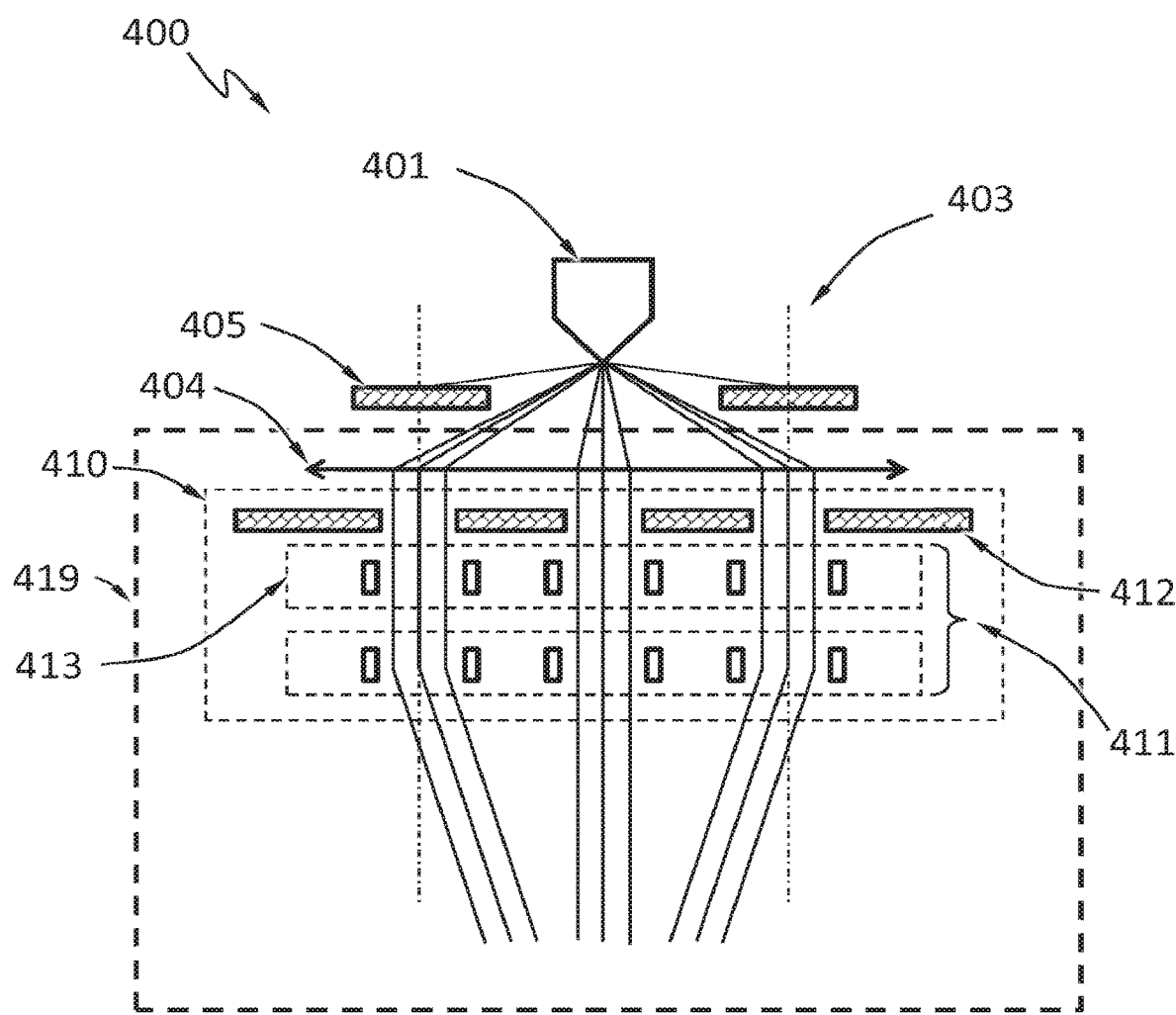
FIG. 2B schematically shows an alternative multi-beam apparatus.

FIG. 2B schematically shows an alternative multi-beam apparatus. The condenser lens 404 collimates the charged particles from the source 401. The optics elements 411 of the source-conversion unit 410 may comprise micro-compensators 413. The micro-compensators 413 may be separate from micro-deflectors or may be integrated with micro-deflectors. If separated, the micro-compensators 413 may be positioned upstream to the micro-deflectors. The micro-compensators 413 are configured to compensate for off-axis aberrations (e.g., field curvature, astigmatism, or distortion) of the condenser lens 404 or an objective lens (such as the objective lens 406 of FIG. 2A). The off-axis aberrations may negatively impact the sizes or positions of the probe spots formed by off-axis (i.e., being not along the primary optical axis of the apparatus) beamlets. The off-axis aberrations of the objective lens 406 may not be completely eliminated by deflection of the beamlets. The micro-compensators 413 may compensate for the residue off-axis aberrations (i.e., the portion of the off-axis aberrations that are not eliminated by deflection of the beamlets) of the objective lens 406, or non-uniformity of the sizes of the probe spots. Each of the micro-compensators 413 is aligned with one of the openings in the electrically conductive layer 412. The micro-compensators 413 may each have four or more poles. The electric currents of the beamlets may be affected by the sizes of the openings in the electrically conductive layer 412 and/or the position of the condenser lens 404.

Figure 2C:
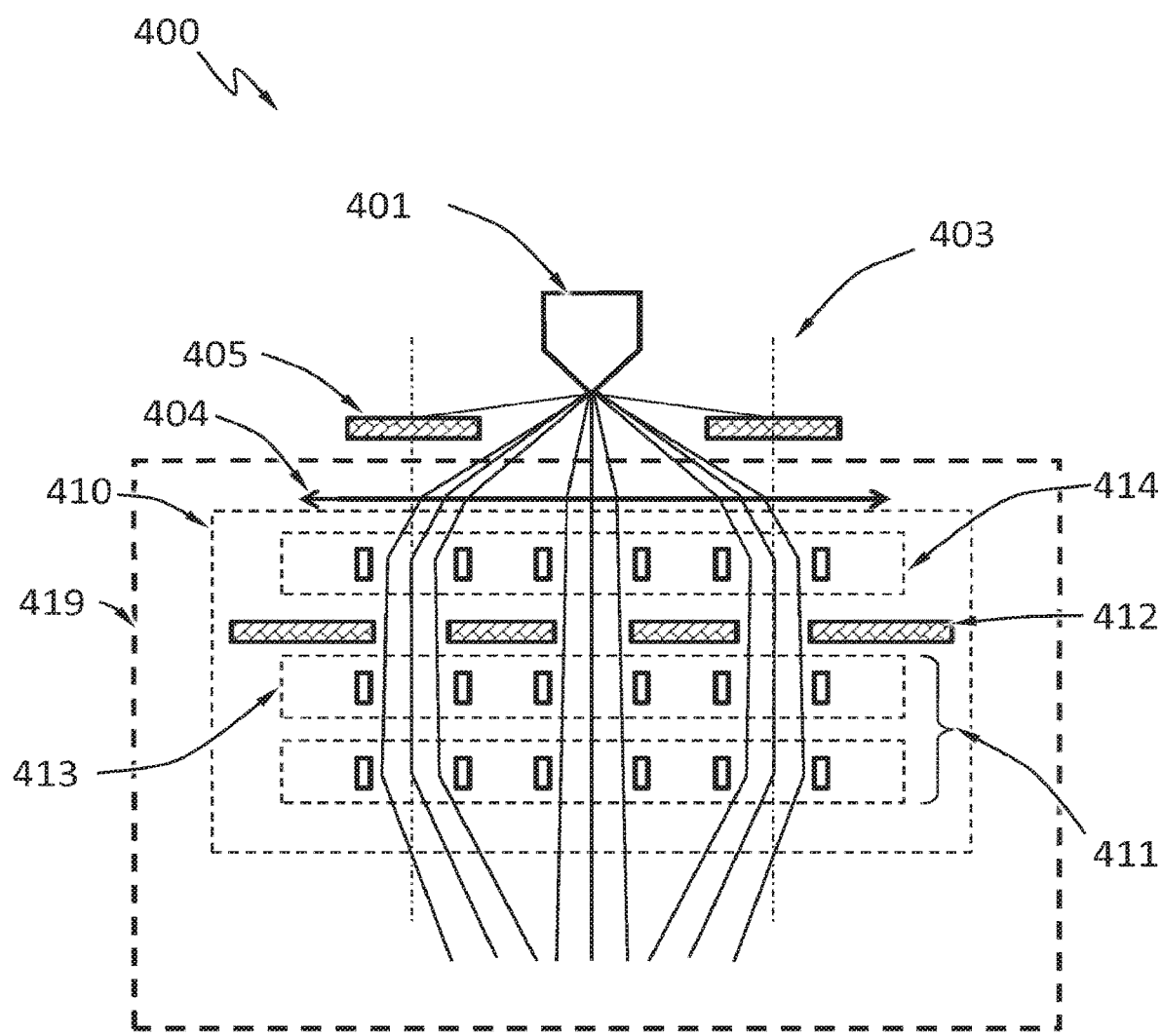
FIG. 2C schematically shows an alternative multi-beam apparatus.

FIG. 2C schematically shows an alternative multi-beam apparatus. The optics elements 411 of the source-conversion unit 410 may comprise pre-bending micro-deflectors 414. The pre-bending micro-deflectors 414 in this example are micro-deflectors configured to bend the beamlets before they go through the openings in the electrically conductive layer 412.

Additional descriptions of apparatuses using multiple beams of charge particles from a single source may be found in U.S. Patent Application Publications 2016/0268096, 2016/0284505 and 2017/0025243, U.S. Pat. No. 9,607,805, U.S. patent application Ser. Nos. 15/365,145, 15/213,781, 15/216,258 and 62/440,493, and PCT Application PCT/US17/15223, the disclosures of which are hereby incorporated by reference in their entirety.

When a particular region of a sample (e.g., a substrate or a patterning device) is to be inspected with a beam of charged particles, the probe spot generated by the beam or the sample can be moved such that the probe spot is within the particular region. Moving the probe spot across the sample can be relatively fast by bending the beam. In the example of the apparatus 100 in FIG. 1, the beam 18 can be bent by applying an electric signal to the scanning deflector 15. Moving the sample is relatively slow because its movement is mechanical (e.g., through a movable stage). The accuracy and precision of the movement of the probe spot may be higher than those of the movement of the sample because the electric signal applied to the deflector may be more easily controlled than the mechanical movement of the sample. Changing the movement of the sample is also more difficult than changing the movement of the probe spot because of the inertia of the sample and any mechanical mechanism configured to move it, and because of hysteresis of the mechanical movement of the sample. At least for these reasons, when the relative position of the probe spot and the sample is to be changed, moving the probe spot is preferable over moving the sample. When the sample has to be moved, for example, due to the limited range of movement of the probe spot, moving the sample at a constant speed (both constant magnitude and constant direction) is preferable over moving the sample at various speeds.

Figure 3A:
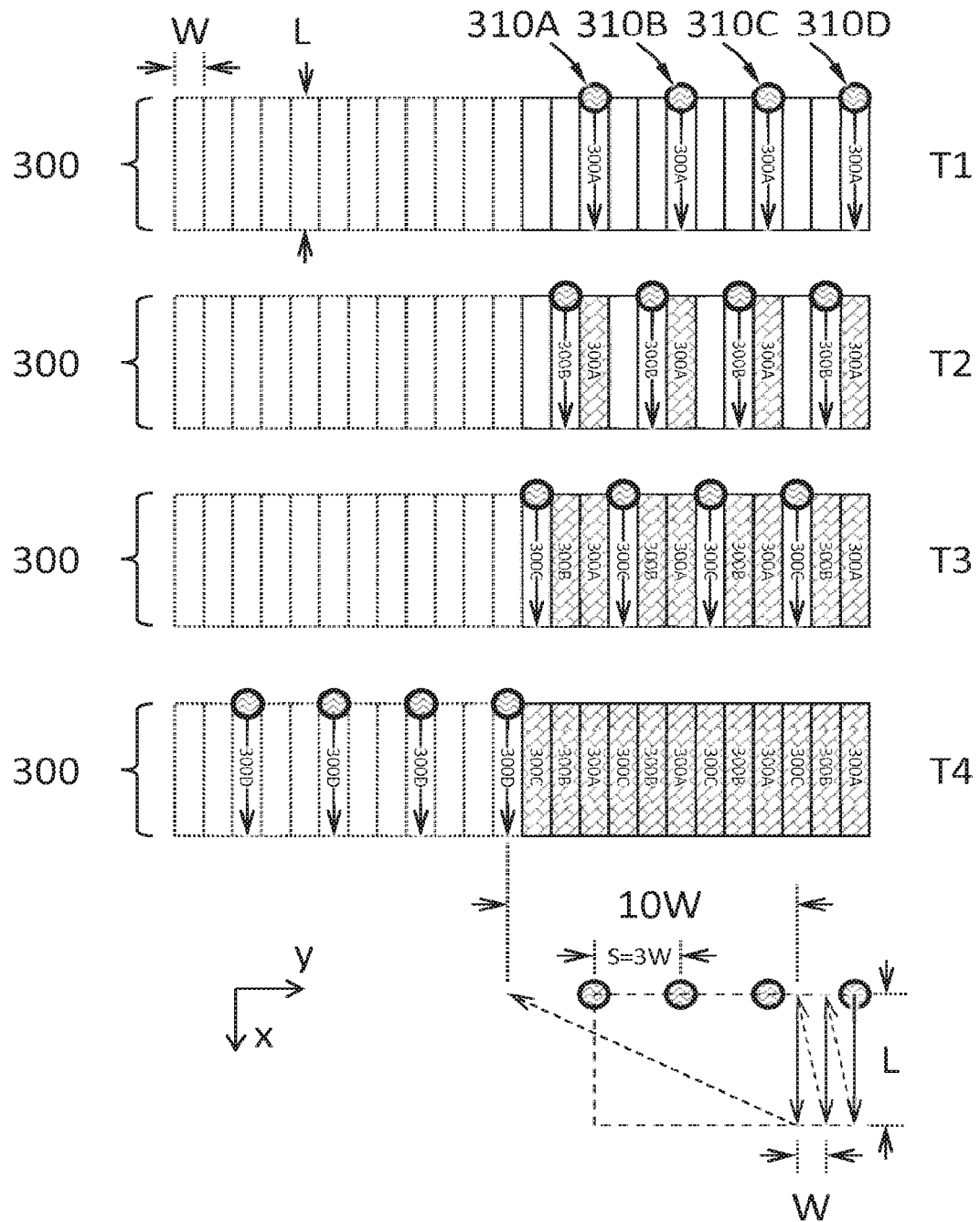
FIG. 3A and FIG. 3B schematically show inspecting a sample using multiple beams of charged particles, according to some embodiments of the present disclosure.
Figure 3B:
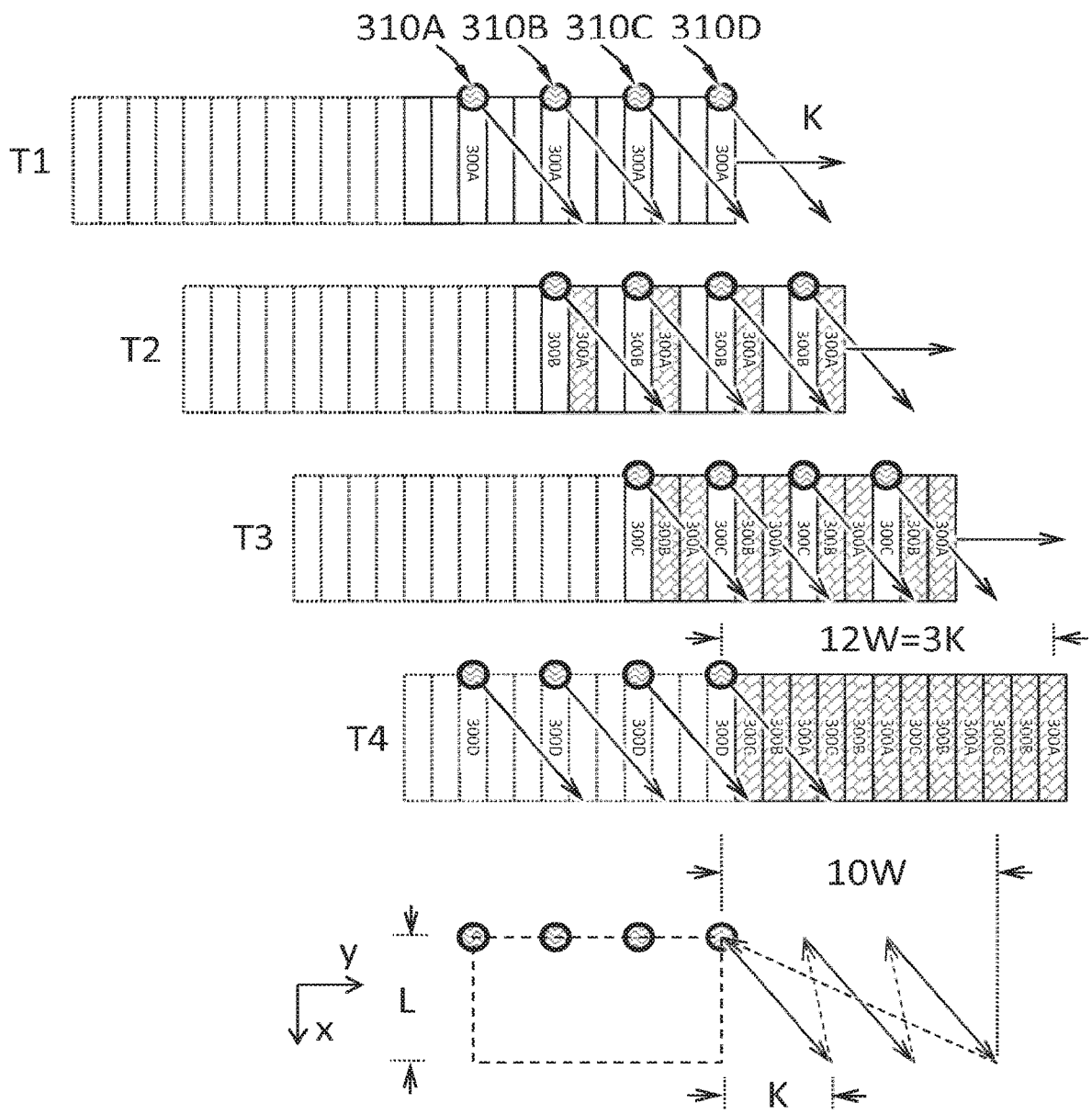

FIG. 3A and FIG. 3B schematically illustrate inspecting a sample using multiple beams of charged particles, according to exemplary embodiments of the present disclosure. In this example illustrated by FIGS. 3A and 3B, four beams generate four probe spots 310A-310D on a sample. FIG. 3A shows the movement of the four probe spots 310A-310D relative to the sample. FIG. 3B shows the movements of the four probe spots 310A-310D and the sample relative to an absolute reference frame. The four probe spots 310A-310D may be, but not necessarily, arranged in a row. In this illustrated example, the diameter of the four probe spots is W. However, in some embodiments, the diameter of the probe spots is not necessarily the same. The region 300 to be inspected shown in this example is rectangular in shape but not necessarily so. For the convenience of explanation, two directions x and y are defined in the absolute reference frame. The x and y directions are mutually perpendicular. As shown in FIG. 3B, during time period T1, the sample moves in the y direction by length K relative to the absolute reference frame but does not move in the x direction relative to the absolute reference frame; and the four probe spots 310A-310D move by length K in they direction relative to the absolute reference frame and move by length L in the x direction relative to the absolute reference frame. Correspondingly, as shown in FIG. 3A, during time period T1, the four probe spots 310A-310D move by zero in the y direction relative to the sample and move by length L in the x direction relative to the sample. As such, during time period T1, the four probe spots 310A-310D move at the same speed as the sample in the y direction.

In the disclosed embodiments, the moving direction of the probe spots 310A-310D during time period T1 does not have to be the same. The length by which the probe spots 310A-310D move during time period T1 does not have to be the same. The probe spots 310A-310D may or may not have movement relative to one another.

In the example illustrated by FIGS. 3A and 3B, during time period T1, four sub-regions 300A are inspected by the four probe spots 310A-310D. At the end of time period T1, the four probe spots 310A-310D nearly instantly move by length L in -x direction relative to the absolute reference frame and nearly instantly move by width W (i.e., width of the one of the four probe spots 310A-310D) in -y direction relative to the absolute reference frame. This movement of the four probe spots 310A-310D is quick enough such that the movement of the sample during this movement is negligible. Alternatively, the time needed for this movement is included in time period T1. Therefore, relative to the sample, the four probe spots 310A-310D move to ends of sub-regions 300B, which may be adjoining sub-regions 300A.

During time periods T2 and T3, the four probe spots 310A-310D and the sample move in the same fashion, as during time period T1. This way, four sub-regions 300B and four sub-regions 300C are inspected by the four probe spots 310A-310D, respectively.

At the end of time period T2, the four probe spots 310A-310D move in the same fashion as at the end of time period T1, to ends of sub-regions 300C. The sub-regions 300C may be adjoining sub-regions 300B.

In the example illustrated by FIGS. 3A and 3B, the pitch S of the four probe spots 310A-310D in the x direction equals 3 W. Therefore, at the end of time period T3, the combination of the inspected sub-regions 300A-300C have no gap in the x direction. At the end of time period T3, the four probe spots 310A-310D nearly instantly move by length L in -x direction relative to the absolute reference frame and nearly instantly move by 10 W in -y direction relative to the absolute reference frame. This movement is quick enough such that the movement of the sample during this movement is negligible. Therefore, relative to the sample, the four probe spots 310A-310D move to ends of sub-regions 300D, one of which may be adjoining one of sub-regions 300C. After this movement, the four probe spots 310A-310D are at the same locations relative to the absolute reference frame, as at the beginning of time period T1. Additional sub-regions (e.g., 300D) may be inspected by the four probe spots 310A-310D during additional time periods (e.g., time period T4).

From the beginning to the end of time periods T1-T3, the sample moves by 3K in the y direction relative to the absolute reference frame; the four probe spots 310A-310D move by zero in the y direction relative to the absolute reference frame; the four probe spots 310A-310D move by 12 W in the -y direction relative to the sample. Therefore, 3K equals 12 W, i.e., K equals 4 W. The speed of the sample during time periods T1-T3 may remain constant.

To generalize, when the number of probe spots is M, and the pitch of the probe spots in the x direction is S=NW, where N is an integer equal to or greater than 2, the number of time periods needed for the combination of inspected sub-regions to have no gaps in the x direction is N and the distance K travelled by the sample during each of the time period equals MW. In the example of FIG. 3A and FIG. 3B, N=3, M=4 and K=4 W.

Figure 3C:
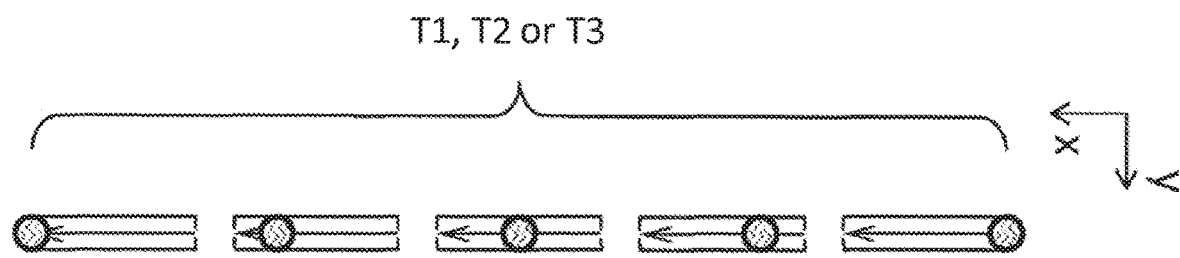
FIG. 3C schematically shows the movement of one of the probe spots in FIG. 3A and FIG. 3B relative to the sample during one of time periods T1, T2 and T3.
Figure 3D:
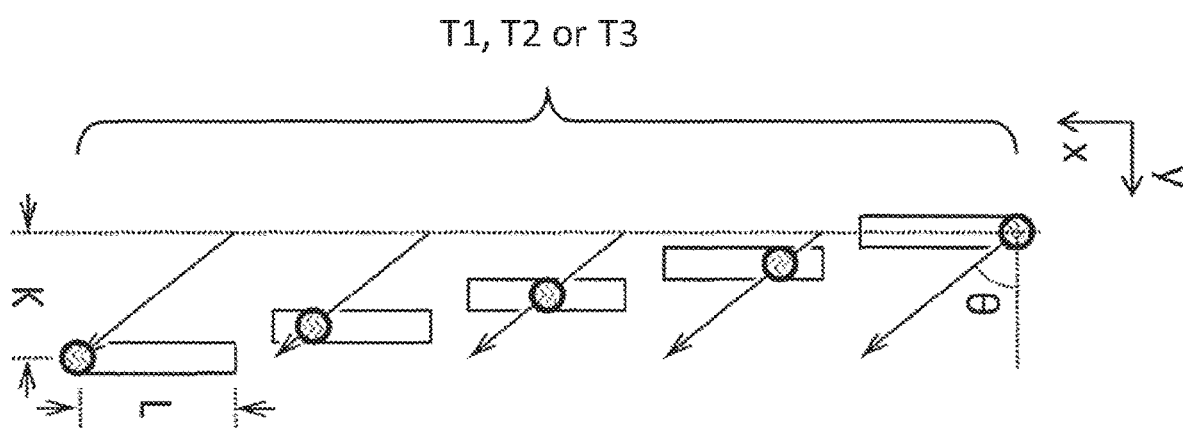
FIG. 3D schematically shows the movement of one of the probe spots in FIG. 3A and FIG. 3B relative to the absolute reference frame during time periods T1, T2 and T3.

FIG. 3C schematically shows the movement of one of the probe spots 310A-310D relative to the sample during one of time periods T1, T2 or T3. Relative to the sample, the probe spot moves only in the x direction by distance L during this time period, but does not move in the y direction. FIG. 3D schematically shows the movement of the probe spot relative to the absolute reference frame during that time period. Relative to the absolute reference frame, the probe spot moves in the x direction by distance L and in the y direction by distance K during this time period. Relative to the absolute reference frame, the movement direction of the probe spot and the movement direction of the sample has an angle θ=arctan(L/K).

Figure 4A:
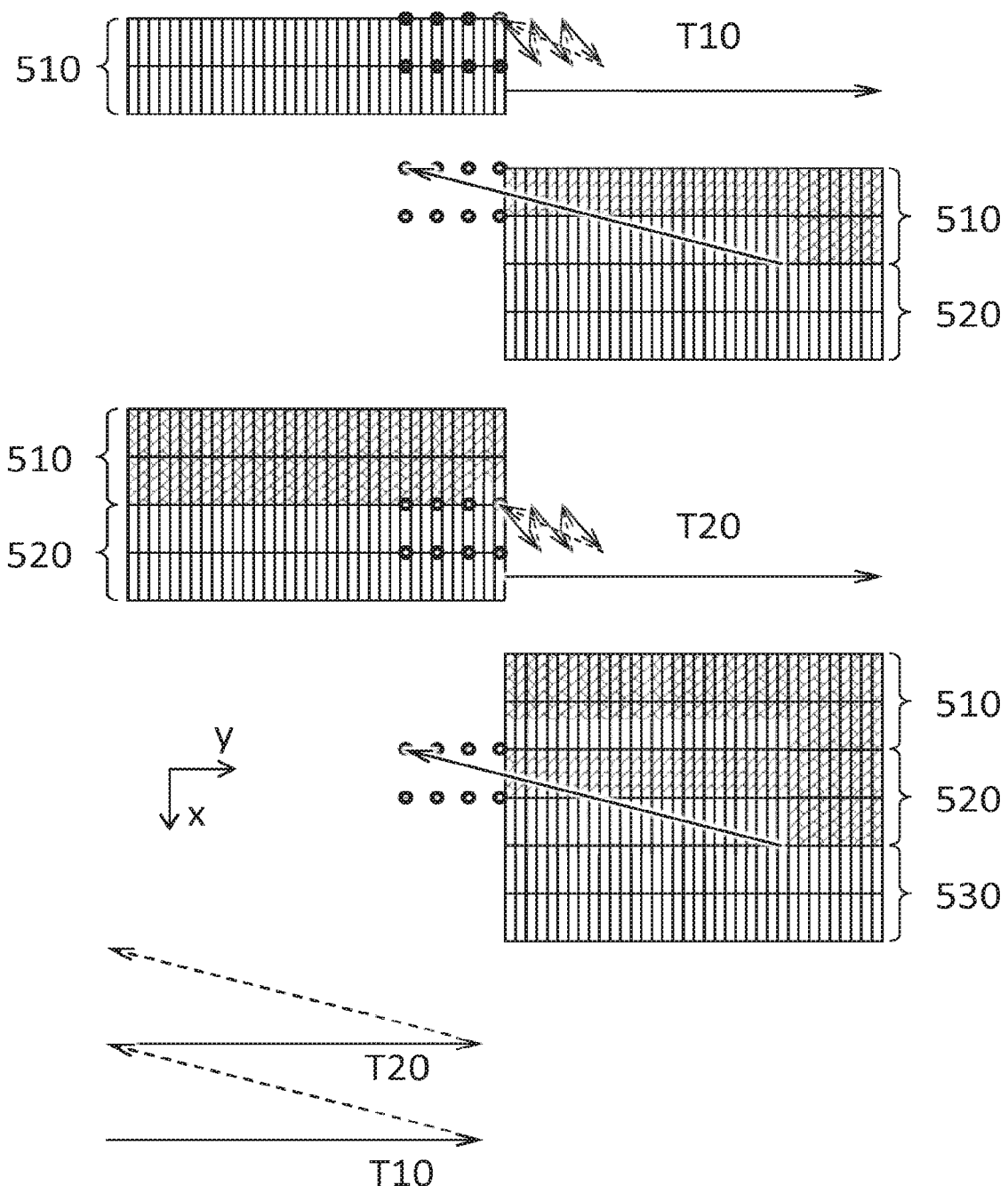
FIG. 4A schematically shows inspecting a sample using multiple beams of charged particles, according to some embodiments of the present disclosure.

FIG. 4A schematically shows inspecting a sample using multiple beams of charged particles, according to exemplary embodiments of the present disclosure. In this example shown, the multiple beams generate multiple probe spots on a sample. The movements of the probe spots and the sample relative to an absolute reference frame are shown in FIG. 4A. The probe spots may be but not necessarily arranged in one or more rows. The regions 510, 520 and 530 to be inspected shown in this example are rectangular in shape but not necessarily so. For convenience, two directions x and y are defined in the absolute reference frame. The x and y directions are mutually perpendicular. The regions 510, 520 and 530 are offset relative to each other along the x direction. Moreover, each of the regions 510, 520 and 530 extends in they direction.

During time period T10, the region 510 is inspected by the probe spots according to the embodiments of FIG. 3A-FIG. 3D. The sample moves to the y direction during time period T10. The probe spots move at the same speed in the y direction as the sample during time period T10. At the end of time period T10, similar to the end of time period T3 in FIG. 3B, the probe spots nearly instantly move in -y direction relative to the absolute reference frame such that the probe spots are at the same locations relative to the absolute reference frame as at the beginning of time period T10. The sample then moves such that the probe spots are positioned at ends of sub-regions of the region 520, where at least one of the sub-regions is at an edge of the region 520 in the y direction.

During time period T20, the region 520 is inspected in the same fashion as during time period T10, with the sample and the probe spots moving at the same speed in the y direction. At the end of time period T20, similar to the end of time period T3 in FIG. 3B, the probe spots nearly instantly move in −y direction relative to the absolute reference frame such that the probe spots are at the same locations relative to the absolute reference frame as at the beginning of time period T20. The sample then moves such that the probe spots are positioned at ends of sub-regions of the region 530, where at least one of the sub-regions is at an edge of the region 530 in the y direction.

During time period T30 (not shown in FIG. 4A), the region 530 is inspected in the same fashion as during time period T10, with the sample and the probe spots moving at the same speed in the y direction.

During the inspection of the regions 510, 520 and 530 shown in FIG. 4A, the sample moves in one direction (i.e., in the y direction). Continuously moving the sample in the same moving direction may reduce the impact of hysteresis in the mechanical movement of the sample.

Figure 4B:
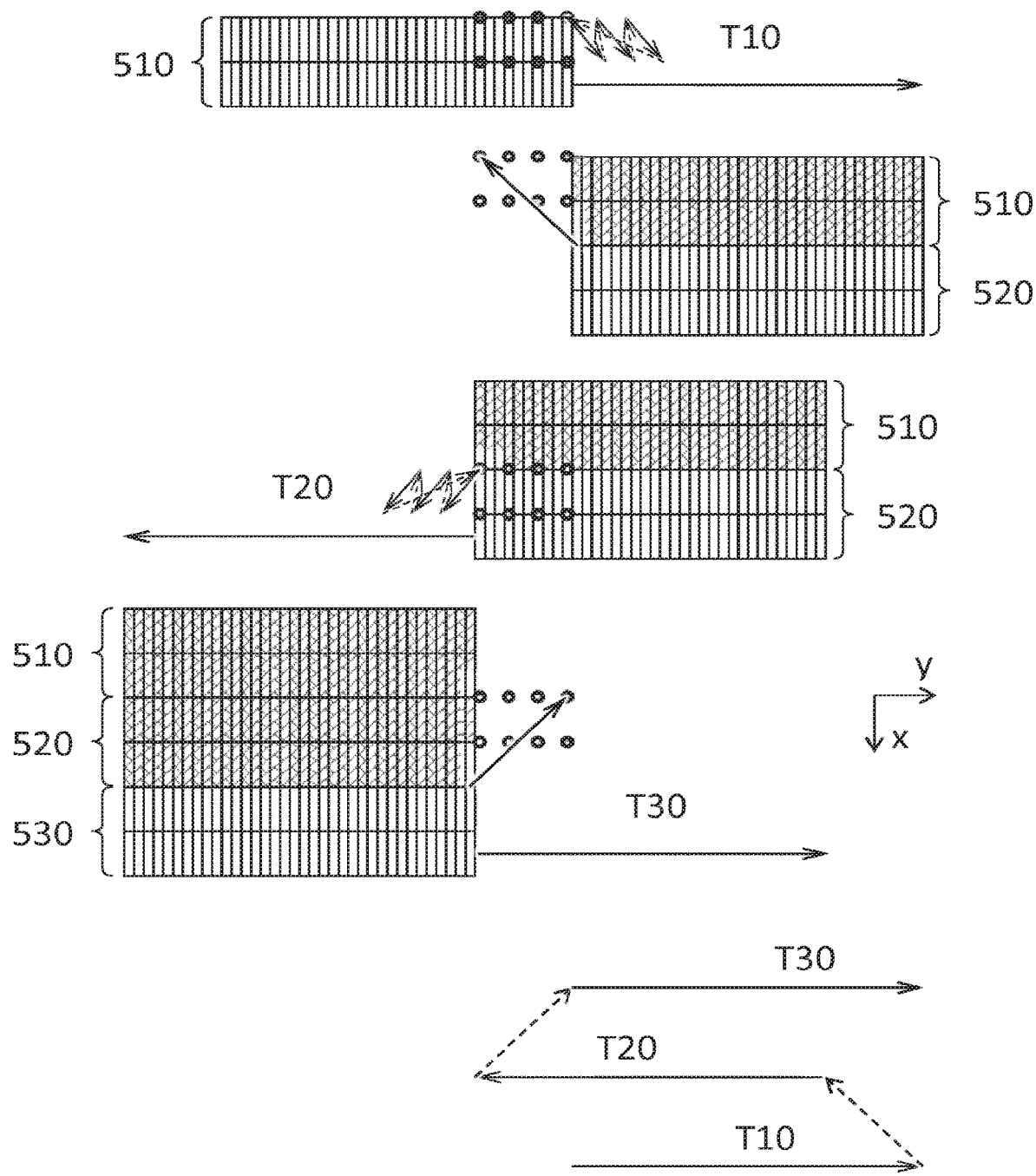
FIG. 4B schematically shows movements of the probe spots and the sample relative to an absolute reference frame, according to some embodiments of the present disclosure.

FIG. 4B schematically shows movements of the probe spots and the sample relative to an absolute reference frame, according to some embodiments of the present disclosure.

During time period T10, the region 510 is inspected by the probe spots according to the embodiments of FIG. 3A-FIG. 3D. The sample moves to the y direction during time period T10. The probe spots and the sample move at the same speed in the y direction during time period T10. At the end of time period T10, similar to the end of time period T3 in FIG. 3B, the probe spots nearly instantly move in −y direction relative to the absolute reference frame such that the probe spots are at the same locations relative to the absolute reference frame as at the beginning of time period T10. The sample then moves such that the probe spots are positioned at ends of sub-regions of the region 520, where at least one of the sub-regions is at the extreme of the region 520 in the −y direction.

During time period T20, the region 520 is inspected by the probe spots according to the embodiments of FIG. 3A-FIG. 3D. The sample moves to the −y direction during time period T20. The probe spots and the sample move at the same speed in the −y direction during time period T20. At the end of time period T20, similar to the end of time period T3 in FIG. 3B, the probe spots nearly instantly move in y direction relative to the absolute reference frame such that the probe spots are at the same locations relative to the absolute reference frame as at the beginning of time period T20. The sample then moves such that the probe spots are positioned at ends of sub-regions of the region 530, where at least one of the sub-regions is at an edge of the region 530 in the −y direction.

During time period T30, the region 530 is inspected in the same fashion as during time period T10, with the sample and the probe spots moving at the same speed in the y direction.

During the inspection of the regions 510, 520 and 530 shown in FIG. 4B, the sample moves back and forth (i.e., in both the −y direction and the y direction). The moving distance of the sample shown in FIG. 4B is shorter than the moving distance of the sample shown in FIG. 4A.

Figure 5:
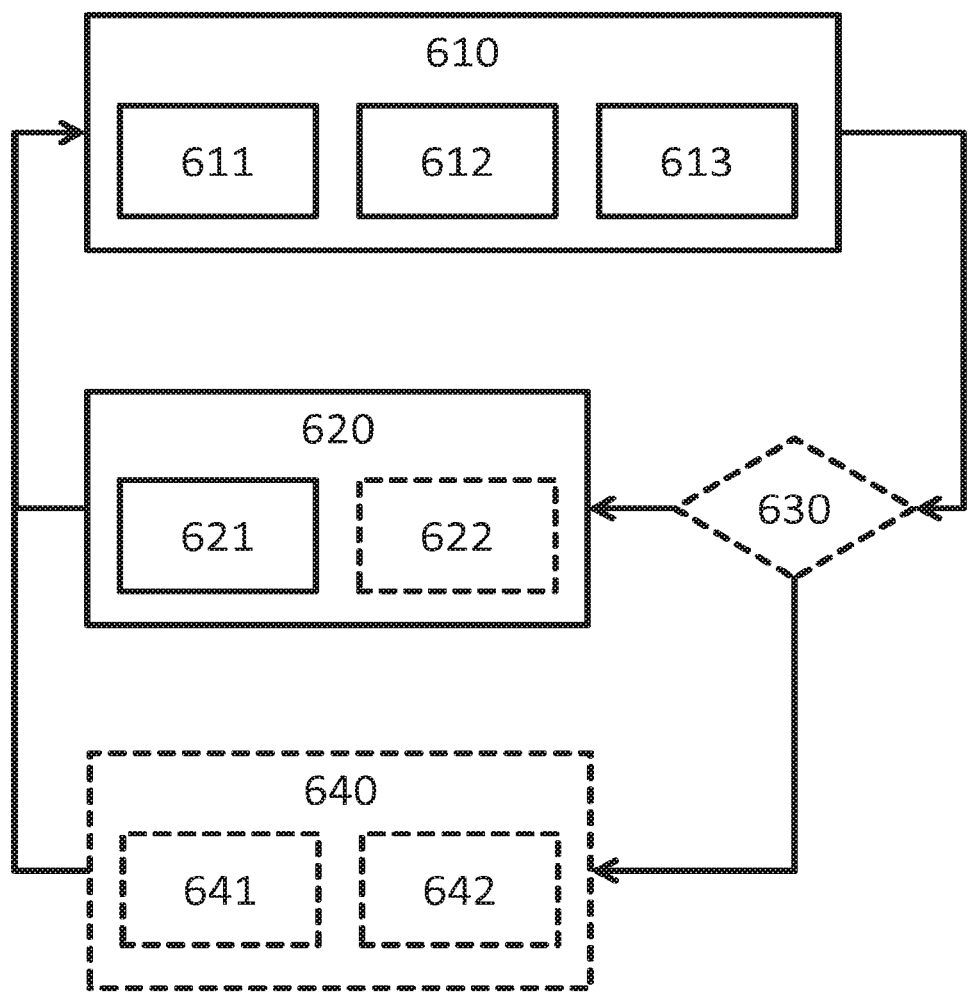
FIG. 5 schematically shows a flowchart for a method of inspecting a sample using multiple probe spots formed on the sample by one or more beams of charged particles.

FIG. 5 is a flowchart of a method of inspecting a sample using multiple probe spots formed on the sample by one or more beams of charged particles. In step 610, the sample is moved by a first distance (e.g. distance K) in a first direction (e.g., they direction) (in sub-step 611); and during the same time period when the sample is moved, the probe spots are moved by the first distance in the first direction (in sub-step 612) and by a second distance (e.g., distance L) in a second direction (e.g., the x direction) (in sub-step 613). While the probe spots are moved on the surface of the sample, a signal representing an interaction (e.g., secondary emission or back-scattered emission) of the charged particles and the sample at the probe spots may be recorded. In step 620, the probe spots are moved by a third distance in an opposite direction (e.g., the −y direction) of the first direction (in sub-step 621), after the stage moves the sample by the first distance in the first direction, wherein the third distance is equal to the first distance less a width (e.g., width W) of one of the probe spots; and optionally, the probe spots are moved by the second distance in an opposite direction (e.g., the −x direction) of the second direction (in optional sub-step 622). The flow then goes back to step 610, such that a next iteration can be started.

In optional step 630, upon determining a region on the sample has been inspected by the one or more beams of charged particles, the flow goes to optional step 640. In optional step 640, the probe spots are moved by a fourth distance in an opposite direction (e.g., the −y direction) of the first direction (in optional sub-step 641), wherein the fourth distance is equal to the width (e.g., width W) of one of the probe spots multiplied by [(M−1)N+1]; and optionally the probe spots are moved by the second distance in an opposite direction (e.g., the −x direction) of the second direction (in optional sub-step 642). Here, M is the number of probe spots spaced apart in the first direction; N is the pitch of the probe spots in the first direction in the unit of the width (e.g., width W) of one of the probe spots. The flow then goes back to step 610, such that a next iteration can be started.

The embodiments may further be described using the following clauses:

1. An apparatus comprising:
   a source configured to emit charged particles;
   a stage configured to support a sample thereon and move the sample by a first distance in a first direction; and
   an optical system configured to:
   form probe spots on the sample with the charged particles,
   while the stage moves the sample by the first distance in the first direction, move the probe spots (i) by the first distance in the first direction and (ii) by a second distance in a second direction, and
   after the stage moves the sample by the first distance in the first direction, move the probe spots by a third distance in an opposite direction of the first direction, the third distance being substantially equal to the first distance less a width of one of the probe spots.
2. The apparatus of clause 1, wherein the charged particles comprise electrons.
3. The apparatus of any one of clauses 1 and 2, further comprising a detector configured to record a signal representing an interaction of the charged particles and the sample at the probe spots.

4. The apparatus of clause 3, wherein the signal includes at least one of secondary electrons, backscattered electrons, Auger electrons, X-ray, and cathodoluminescence.
5. The apparatus of any one of clauses 1-4, wherein the optical system is configured to move the probe spots by the second distance in an opposite direction of the second direction.
6. The apparatus of any one of clauses 1-5, wherein:
the probe spots are spaced apart in the first direction and M is a number of the probe spots;
N is a pitch of the probe spots in the first direction, N being an integer and measured by a unit of the width of one of the probe spots; and
the optical system is further configured to:
after the probe spots are moved by the pitch in the opposite direction of the first direction, move the probe spots by a fourth distance in the opposite direction of the first direction, the fourth distance being substantially equal to [(M−1)N+1] multiplied by the width of one of the probe spots.
7. The apparatus of any one of clauses 1-6, wherein the optical system includes one or more of a lens, a stigmator, and a deflector.
8. A method comprising:
moving a sample by a first distance in a first direction;
while the sample is being moved by the first distance in the first direction, moving probe spots on the sample (i) by the first distance in the first direction and (ii) by a second distance in a second direction, simultaneously, the probe spots being formed on the sample by one or more beams of charged particles; and
after the sample is moved by the first distance in the first direction, moving the probe spots by a third distance in an opposite direction of the first direction, the third distance being substantially equal to the first distance less a width of one of the probe spots.
9. The method of clause 8, wherein the charged particles comprise electrons.
10. The method of any one of clauses 8 and 9, further comprising recording a signal representing an interaction of the charged particles and the sample at the probe spots.
11. The method of clause 10, wherein the signal includes at least one of secondary electrons, backscattered electrons, Auger electrons, X-ray, and cathodoluminescence.
12. The method of any one of clauses 8-11, further comprising moving the probe spots by the second distance in an opposite direction of the second direction.
13. The method of any one of clauses 8-12, wherein:
the probe spots are spaced apart in the first direction and M is a number of the probe spots;
N is a pitch of the probe spots in the first direction, N being an integer and measured by a unit of the width of one of the probe spots; and
the method further comprises:
after determining that the probe spots are moved by the pitch in the opposite direction of the first direction, moving the probe spots by a fourth distance in the opposite direction of the first direction, the fourth distance being substantially equal to [(M−1)N+1] multiplied by the width of one of the probe spots.
14. The method of clause 13, further comprising moving the probe spots by the second distance in an opposite direction of the second direction.
15. A computer program product comprising a non-transitory computer readable medium having instructions that, when executed by a computer, cause the computer to perform the method of any one of clauses 8-14.

Although the disclosure above is made with respect to multi-beam apparatuses (i.e., apparatuses that can carry out charged particle beam inspection using multiple beams of charge particles, where the charged particles in the multiple beams are from a single source), the embodiments may be applicable in multi-column apparatuses (i.e., apparatuses that can carry out charged particle beam inspection using multiple beams of charge particles, where the multiple beams of charge particles are produced from multiple sources). Additional descriptions of multi-column apparatuses may be found in U.S. Pat. No. 8,294,095, the disclosure of which is hereby incorporated by reference in its entirety.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:
1. An apparatus comprising:
a source configured to emit charged particles;
a stage configured to support a sample thereon and move the sample by a first distance in a first direction; and
an optics system configured to:
form probe spots on the sample with the charged particles,
while the stage moves the sample by the first distance in the first direction, move the probe spots (i) by the first distance in the first direction and (ii) by a second distance in a second direction, and
after the stage moves the sample by the first distance in the first direction, move the probe spots by a third distance in an opposite direction of the first direction, wherein the first distance is equal to a product of a number of the probe spots and a width of the one of the probe spots, and wherein the third distance is substantially equal to the first distance less the width of one of the probe spots.
2. The apparatus of claim 1, wherein the charged particles comprise electrons.
3. The apparatus of claim 1, further comprising a detector configured to record a signal representing an interaction of the charged particles and the sample at the probe spots.
4. The apparatus of claim 3, wherein the signal comprises secondary electrons, backscattered electrons, Auger electrons, X-ray, or cathodoluminescence.
5. The apparatus of claim 1, wherein the optics system is further configured to move the probe spots by the second distance in an opposite direction of the second direction.
6. The apparatus of claim 1, wherein:
the probe spots are spaced apart in the first direction and M is the number of the probe spots;
N is a pitch of the probe spots in the first direction, N being an integer and measured by a unit of the width of one of the probe spots; and
the optics system is further configured to:

after the probe spots are moved by the pitch in the opposite direction of the first direction, move the probe spots by a fourth distance in the opposite direction of the first direction, the fourth distance being substantially equal to [(M−1)N+1] multiplied by the width of one of the probe spots.

7. The apparatus of claim 1, wherein the optics system comprises a lens, a stigmator, or a deflector.

8. A method comprising:
moving a sample by a first distance in a first direction;
while the sample is being moved by the first distance in the first direction, moving probe spots on the sample (i) by the first distance in the first direction and (ii) by a second distance in a second direction, simultaneously, the probe spots being formed on the sample by one or more beams of charged particles; and
after the sample is moved by the first distance in the first direction, moving the probe spots by a third distance in an opposite direction of the first direction,
wherein the first distance is equal to a product of a number of the probe spots and a width of the one of the probe spots, and wherein the third distance is substantially equal to the first distance less the width of one of the probe spots.

9. The method of claim 8, wherein the charged particles comprise electrons.

10. The method of claim 8, further comprising recording a signal representing an interaction of the charged particles and the sample at the probe spots.

11. The method of claim 10, wherein the signal comprises secondary electrons, backscattered electrons, Auger electrons, X-ray, or cathodoluminescence.

12. The method of claim 8, further comprising moving the probe spots by the second distance in an opposite direction of the second direction.

13. The method of claim 8, wherein:
the probe spots are spaced apart in the first direction and M is the number of the probe spots;
N is a pitch of the probe spots in the first direction, N being an integer and measured by a unit of the width of one of the probe spots; and
the method further comprises:
after determining that the probe spots are moved by the pitch in the opposite direction of the first direction, moving the probe spots by a fourth distance in the opposite direction of the first direction, the fourth distance being substantially equal to [(M−1)N+1] multiplied by the width of one of the probe spots.

14. The method of claim 13, further comprising moving the probe spots by the second distance in an opposite direction of the second direction.

15. A computer program product comprising a non-transitory computer readable medium having instructions that, when executed by a computer, cause the computer to perform the method of claim 8.

16. The apparatus of claim 1, wherein the probe spots and the sample move at a substantially similar speed in the first direction.

17. The apparatus of claim 1, wherein an angle, with respect to the first direction, formed by a simultaneous movement of the probe spots in the first and the second direction, is an inverse of a tangent of a ratio between the second distance and a corresponding first distance.

18. The method of claim 8, wherein the probe spots and the sample move at a substantially similar speed in the first direction.

19. The method of claim 8, wherein an angle, with respect to the first direction, formed by simultaneously moving the probe spots in the first and the second direction, is an inverse of a tangent of a ratio between the second distance and a corresponding first distance.

20. The apparatus of claim 6, wherein the first distance in the first direction is substantially equal to a product of the number of the probe spots and the pitch of the probe spots measured by a unit of the width of one of the probe spots.

* * * * *